United States Patent
Hareland

(10) Patent No.: US 6,714,061 B2
(45) Date of Patent: Mar. 30, 2004

(54) SEMICONDUCTOR CONTROLLED RECTIFIER / SEMICONDUCTOR CONTROLLED SWITCH BASED ESD POWER SUPPLY CLAMP WITH ACTIVE BIAS TIMER CIRCUITRY

(75) Inventor: Scott Hareland, Tigard, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/198,686

(22) Filed: Jul. 17, 2002

(65) Prior Publication Data
US 2004/0012431 A1 Jan. 22, 2004

(51) Int. Cl.[7] .............................. H03K 5/08; H03L 5/00
(52) U.S. Cl. ........................ 327/310; 327/319; 327/320
(58) Field of Search ................................. 327/310, 313, 327/319, 321, 324, 326, 330; 361/56, 91.1, 91.3, 91.5, 91.8

(56) References Cited

U.S. PATENT DOCUMENTS

| | | | | |
|---|---|---|---|---|
| 3,904,931 A | * | 9/1975 | Leidich | 361/56 |
| 5,528,188 A | * | 6/1996 | Au et al. | 327/310 |
| 5,781,388 A | * | 7/1998 | Quigley | 361/56 |
| 5,903,420 A | * | 5/1999 | Ham | 361/56 |
| 6,226,162 B1 | * | 5/2001 | Kladar et al. | 361/56 |
| 6,229,183 B1 | * | 5/2001 | Lee | 257/360 |
| 6,275,089 B1 | * | 8/2001 | Song et al. | 327/314 |
| 6,288,884 B1 | * | 9/2001 | Yu | 361/111 |
| 6,465,848 B2 | * | 10/2002 | Ker et al. | 257/355 |

FOREIGN PATENT DOCUMENTS

JP        10-126962        *  5/1998

OTHER PUBLICATIONS

US 2002/0154463A1, Mergens et al.*
US 2002/0122280A1, Ker et al.*
US 2002/0089017 A1, Lai et al.*

* cited by examiner

Primary Examiner—Tuan T. Lam
(74) Attorney, Agent, or Firm—Blakely, Sokoloff, Taylor & Zafman LLP

(57) ABSTRACT

A circuit for reducing leakage current in an ESD overvoltage protection circuit is described. Specifically, the circuit uses a semiconductor controlled rectifier or a semiconductor controlled switch to minimize the leakage.

3 Claims, 4 Drawing Sheets

SEMICONDUCTOR CONTROLLED RECTIFIER / SEMICONDUCTOR CONTROLLED SWITCH BASED ESD POWER SUPPLY CLAMP WITH ACTIVE BIAS TIMER CIRCUITRY

FIELD OF THE INVENTION

The present invention pertains to the field of integrated circuit design. More particularly, the present invention relates to a circuit to place a device in a forward conducting state during transient power supply overvoltage events and to turn the device off during normal operation.

BACKGROUND OF THE INVENTION

On an integrated circuit chip, power rails are typically used to supply power to the chip. The power rails may comprise a positive power source Vcc and a ground Vss. Ideally, the power rails provide constant, steady voltages to the chip. Noise on the power rails, however, may cause voltage spikes or overvoltage on the Vcc network. Transient voltage on the Vcc network is a typical electrostatic discharge (ESD) event. ESD is potentially dangerous to transistors on an integrated circuit. Thus, overvoltage protection circuits are used to help discharge ESD events.

One example of an ESD overvoltage protection circuit is depicted in FIG. 1. The circuit includes power rails Vcc 100 and Vss 105, a timer circuit comprising resistor 110 and capacitor 120, a first inverter comprising transistors 130 and 140 coupled to the timer circuit, a second inverter comprising transistors 150 and 160 coupled to the first inverter, a capacitor 170 coupled to the second inverter, and a transistor 180 coupled to capacitor 170. The transistor 180 is typically a large PMOS device.

In normal operation, node 125 is held high by the timer circuit. The first inverter inverts the signal of node 125 and outputs an active low signal at node 155. The second inverter then inverts the active low signal of node 155 and outputs an active high signal at node 175. Because the node 175 is active high in normal operation, the transistor 180 is turned off.

During a voltage transient on Vcc 100, the first inverter is toggled and outputs an active high signal at node 155. The second inverter is also toggled and outputs an active low signal at node 175, turning on transistor 180. The transistor 180, being a large PMOS transistor, is capable of shunting a large amount of current between power rails Vcc 100 and Vss 105, which helps to discharge the ESD event. As the overvoltage is reduced, the inverters revert back to their normal logic levels and turn the transistor 180 off.

The transistor 180, however, may be an appreciable source of leakage current between power rails Vcc 100 and Vss 105 during normal operation. The current trend in integrated circuit deign in CMOS technologies is toward ultra thin gate oxides, which tends to create higher levels of gate and subthreshold leakage. A typical product may have dozens of power supply clamps placed throughout the die. This can be problematic for power constrained or low-power applications. Therefore, a power clamping circuit that reduces standby leakage is desired.

BRIEF DESCRIPTION OF THE DRAWINGS

The embodiments of the present invention are illustrated by way of example and not in the figures of the accompanying drawings, in which like references indicate similar elements and in which.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Figure 2A:
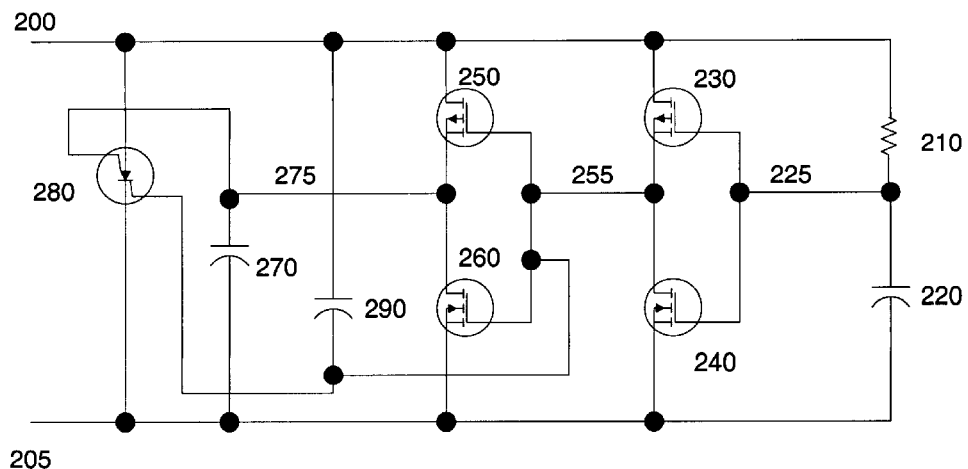
FIG. 2A is an embodiment of an ESD protection circuit that minimizes steady state leakage current.

FIG. 2A depicts one embodiment of the invention. The power supply clamping circuit of FIG. 2A comprises power rails Vcc 200 and Vss 205 and a timer circuit. For this embodiment of the invention, the timer circuit comprises resistor 210 and capacitor 220. A first inverter comprising transistors 230 and 240 is coupled to the timer circuit. A second inventor comprising transistors 250 and 260 and a first capacitor 290 are coupled to the output of the first inverter. A semiconductor controlled switch (SCS) 280 and a second capacitor 270 is coupled to the output of the second inverter. The SCS 280 is a four terminal PNPN device that provides a discharge path between Vcc 200 and Vss 205 during transient overvoltage events.

Figure 3:
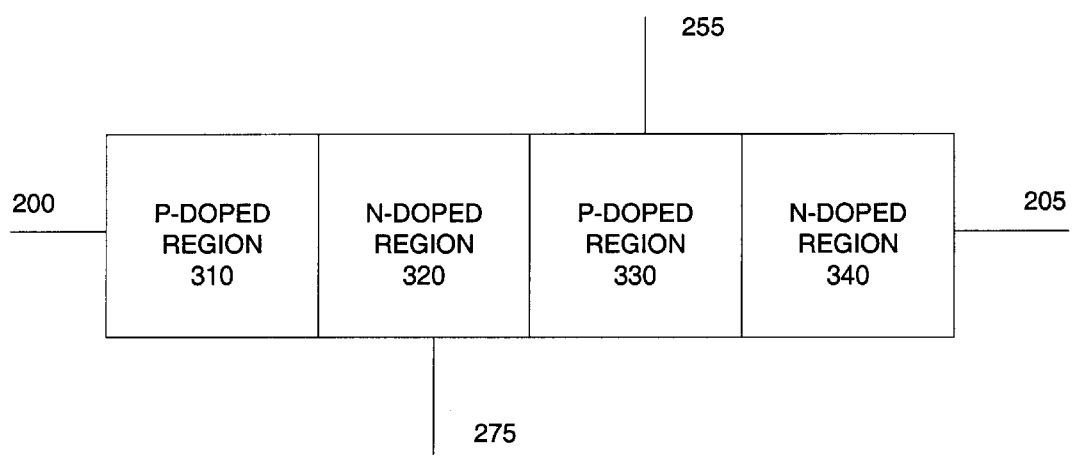
FIG. 3 is an embodiment of a semiconductor controlled switch.

An embodiment of the four terminal SCS 280 is depicted in FIG. 3. The SCS 280 comprises a first p-doped region 310, a first n-doped region 320, a second p-doped region 330, and a second n-doped region 340. The first p-doped region 310 is coupled to Vcc 200 and the second n-doped region 340 is coupled to Vss 205. The second p-doped region 330 is coupled to node 255 and the first n-doped region 320 is coupled to node 275.

Figure 1:
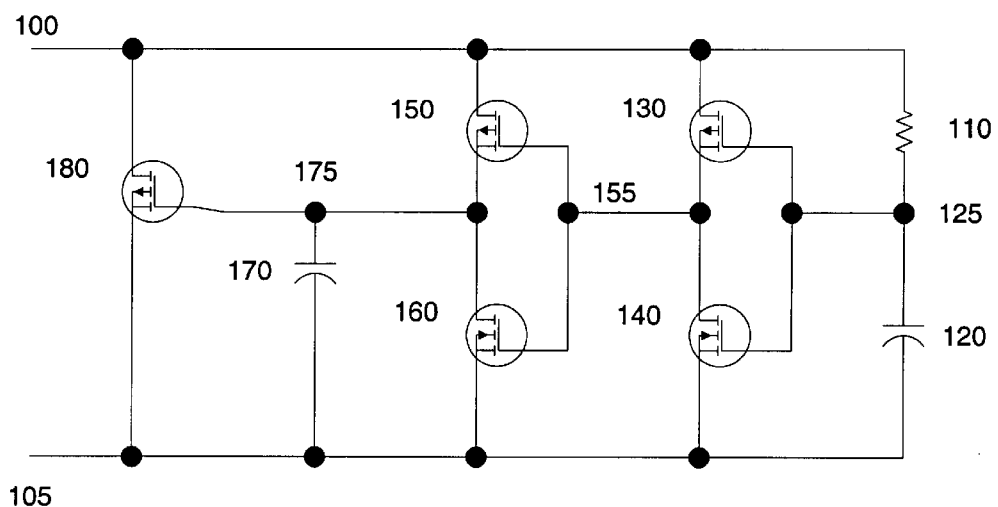
FIG. 1 is a prior art ESD protection circuit.

During normal operation, the SCS 280 is maintained in a forward blocking state to reduce leakage. Because node 255 is active low during normal operation and node 275 is active high during normal operation, the internal PN junction of the SCS 280 formed by n-doped region 320 and p-doped region 330 is kept in reverse bias which helps to prevent the SCS 280 from conducting current. The circuit of FIG. 2A helps to reduce the gate or transistor subthreshold leakage of power clamping circuits such as the large transistor structure of FIG. 1.

During an ESD event, the high Vcc 200 to Vss 205 bias applied to the p-doped region 310 and the n-doped region 340 of SCS 280 will work to trigger the SCS 280 into a forward conducting state. In addition, the combination of node 255 being pulled active high and node 275 being pulled active low will help facilitate the transition of the SCS 280 to a forward conducting state. When the ESD event occurs, capacitor 220 charges to the new Vcc 200 value. If the node 225 attains a high enough value to trip transistor 230, node 255 becomes an active high state. The second inverter then outputs an active low signal at node 275.

The capacitors 290 and 270 help to modulate the effects of ESD events. The capacitors 290 and 270, however, should be weak enough so that the first and second inverters can toggle the nodes 255 and 275 during an ESD event. Thus, capacitors 290 and 270 may be sized to be values less than the internal capacitances of SCS 280.

To turn off the SCS 280 after the voltage transient is reduced, nodes 255 and 275 transition back to their steady state operating points which halts bipolar action of the SCS 280 and returns the device back to the forward blocking state to reduce leakage. Thus, node 225 returns to an active high state, the first inverter outputs an active low signal at node 255, and the second inverter outputs an active high signal at node 275. The size of SCS 280 may be adjusted to optimize the turn-on and the turn-off characteristics of the bipolar transition in addition to maintaining clamp stability.

Because the values of nodes 255 and 275 depend upon node 225, the time for the SCS 280 to return to a forward blocking stage is also controlled in part by the speed in which the timer circuit takes to charge capacitor 220 back to an active high state. This voltage charging speed is defined by an RC time constant, which depends on the values of resistor 210 and capacitor 220. The values of resistor 210 and capacitor 220 may be chosen such that the RC time constant is approximately one microsecond. The value of resistor 210 may be approximately one Mega-ohm.

For another embodiment of the invention, the SCS 280 may be substituted with a semiconductor controlled rectifier (SCR). A SCR is a three terminal PNPN transistor. Because a SCR has only three terminals, the SCR offers less control in placing the internal junction of the transistor in reverse or forward bias, but should otherwise provide the same functionality as the SCS 280.

Figure 2B:
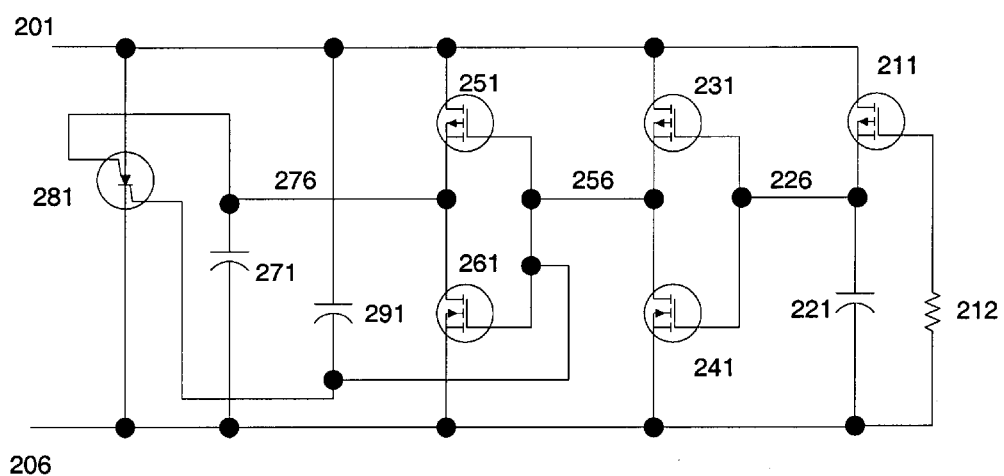
FIG. 2B is another embodiment of an ESD protection circuit that minimizes steady state leakage current.

FIG. 2B depicts yet another embodiment of the invention. The power supply clamping circuit of FIG. 2B comprises power rails Vcc 201 and Vss 206, and a RC timer circuit. For this embodiment of the invention, the timer circuit comprises transistor 211, resistor 212, and capacitor 221. The transistor 211 functions as the resistance in the RC timer circuit. The transistor 211 may have a resistance in the Mega-ohm range.

A first inverter comprising transistors 231 and 241 is coupled to resistor 211 and capacitor 221. A second inventor comprising transistors 251 and 261 and a first capacitor 291 are coupled to the output of the first inverter. A semiconductor controlled switch (SCS) 281 and a second capacitor 271 is coupled to the output of the second inverter. The SCS 281 is a four terminal PNPN device that provides a discharge path between Vcc 201 and Vss 201 during transient overvoltage events.

Figure 4:
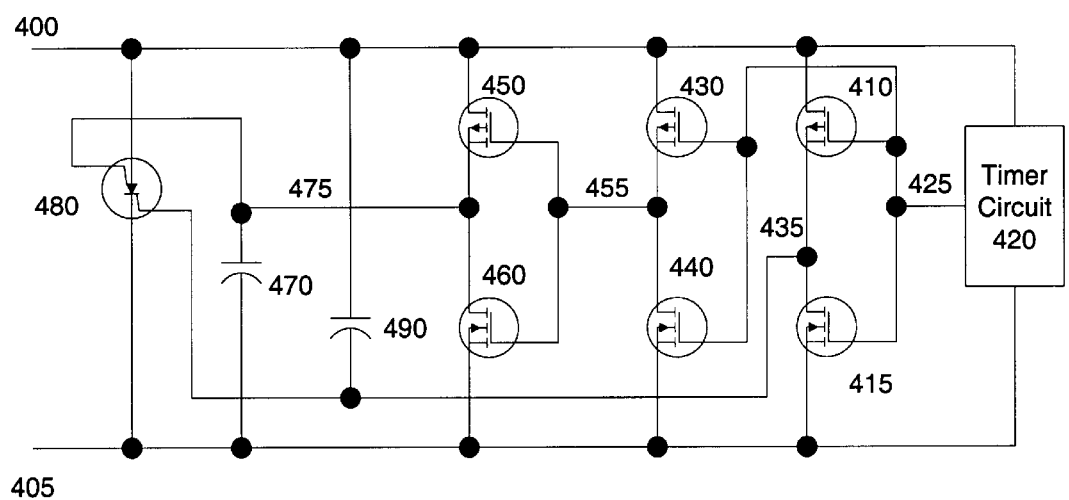
FIG. 4 is an embodiment of an optimized ESD protection circuit that minimizes steady state leakage current.

FIG. 4 depicts yet another embodiment of the invention. The circuit comprises power rails 400 and 405 and timer circuit 420. A first inverter comprising transistors 410 and 415 is coupled to the timer circuit 420. A second inverter comprising transistors 430 and 440 and is coupled to the output of the first inverter. A third inverter comprising transistors 450 and 460 and a first capacitor 490 are coupled to the output of the second inverter. A second capacitor 470 and an SCS 480 are coupled to the output of the third inverter. The circuit of FIG. 4 optimizes the circuits of FIG. 2A and FIG. 2B by preventing the first inverter from having to drive both the second inverter and the SCS device. Instead, the output load of the first inverter is broken up in order to provide cleaner signals to the triggers of the SCS 480. The trade-off of the optimized circuit of FIG. 4 is that is takes up more die area than the previously described circuits.

In the foregoing specification the invention has been described with reference to specific exemplary embodiments thereof. It will, however, be evident that various modification and changes may be made thereto without departure from the broader spirit and scope of the invention as set forth in the appended claims. The specification and drawings are, accordingly, to be regarded in an illustrative rather than restrictive sense.

What is claimed is:

1. A method to reduce leakage in an electrostatic discharge (ESD) protection circuit, comprising:

placing a semiconductor controlled switch (SCS) in a forward blocking state during steady state operation, wherein the SCS comprises a first terminal coupled to a voltage source, a second terminal coupled to ground, a third terminal coupled to a first inverter, and a fourth terminal coupled to a second inverter; and triggering the SCS into a forward conducting state during an ESD event, wherein the first inverter sends a first signal to the third terminal and the second inverter sends a second signal to the fourth terminal.

2. The method of claim 1, further comprising sending a signal to the SCS to return the SCS to the forward blocking state.

3. The method of claim 2, wherein a timer circuit generates the signal.

* * * * *